United States Patent
Yang et al.

(10) Patent No.: US 11,162,174 B2
(45) Date of Patent: Nov. 2, 2021

(54) LIQUID DELIVERY AND VAPORIZATION APPARATUS AND METHOD

(71) Applicant: Taiwan Semiconductor Manufacturing Co., Ltd., Hsinchu (TW)

(72) Inventors: Hsin-Lung Yang, Hsinchu (TW); Chui-Ya Peng, Hsinchu (TW); Chih-Ta Kuan, Hsinchu (TW)

(73) Assignee: Taiwan Semiconductor Manufacturing Co, Ltd., Hsinchu (TW)

( * ) Notice: Subject to any disclaimer, the term of this patent is extended or adjusted under 35 U.S.C. 154(b) by 456 days.

(21) Appl. No.: 16/136,870

(22) Filed: Sep. 20, 2018

(65) Prior Publication Data

US 2020/0095681 A1    Mar. 26, 2020

(51) Int. Cl.
| | |
|---|---|
| *H01L 21/67* | (2006.01) |
| *C23C 16/455* | (2006.01) |
| *C23C 16/52* | (2006.01) |
| *C23C 16/46* | (2006.01) |
| *C23C 16/448* | (2006.01) |

(52) U.S. Cl.
CPC .... *C23C 16/45544* (2013.01); *C23C 16/4481* (2013.01); *C23C 16/46* (2013.01); *C23C 16/52* (2013.01); *H01L 21/67017* (2013.01); *H01L 21/67167* (2013.01); *H01L 21/67201* (2013.01); *H01L 21/67207* (2013.01)

(58) Field of Classification Search
None
See application file for complete search history.

(56) References Cited

U.S. PATENT DOCUMENTS

| | | | | |
|---|---|---|---|---|
| 5,981,399 A | * | 11/1999 | Kawamura | ....... H01L 21/67167 438/715 |
| 2003/0155882 A1 | * | 8/2003 | Ono | ......... F16F 6/00 318/649 |
| 2007/0042581 A1 | * | 2/2007 | Sano | ........ C23C 16/45531 438/537 |
| 2007/0269983 A1 | * | 11/2007 | Sneh | ........ C23C 16/45557 438/689 |
| 2009/0000740 A1 | | 1/2009 | Kojima et al. | |
| 2010/0236480 A1 | | 9/2010 | Hara et al. | |
| 2017/0137936 A1 | | 5/2017 | Birtcher et al. | |
| 2018/0174826 A1 | * | 6/2018 | Raaijmakers | ....... H01L 21/0273 |

* cited by examiner

*Primary Examiner* — Mandy C Louie
(74) *Attorney, Agent, or Firm* — Sterne, Kessler, Goldstein & Fox P.L.L.C.

(57) ABSTRACT

The present disclosure relates to an apparatus and a method of delivering a liquid to a downstream process. The apparatus can include a vessel configured to retain a liquid, a bellow in fluid communication with the vessel to receive the liquid from the vessel and in fluid communication with the downstream process to deliver the liquid. The bellow can be exposed to a constant external pressure and configured to deliver the liquid under the constant external pressure when the bellow stops receiving the liquid from the vessel. In some embodiments, the constant external pressure is atmospheric pressure. The bellow can include a pressure deformable material. The apparatus can further include a vaporizer configured to receive the liquid and to produce a vapor, one or more chemical vapor deposition chambers configured to receive the vapor and to hold a substrate for deposition of a component of the vapor on a substrate.

20 Claims, 4 Drawing Sheets

LIQUID DELIVERY AND VAPORIZATION APPARATUS AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features can be arbitrarily increased or reduced for clarity of illustration and discussion.

DETAILED DESCRIPTION

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows can include embodiments in which the first and second features are formed in direct contact, and can also include embodiments in which additional features are disposed between the first and second features, such that the first and second features are not in direct contact. In addition, the present disclosure can repeat reference numerals and/or letters in the various examples. This repetition does not in itself dictate a relationship between the various embodiments and/or configurations discussed.

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "vertical," as used herein, means nominally perpendicular to the surface of a substrate.

The term "substantially" as used herein indicates the value of a given quantity that can vary based on a particular technology node associated with the subject semiconductor device. Based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. Based on the particular technology node, the term "about" can indicate a value of a given quantity that varies within, for example, 5-30% of the value (e.g., ±5%, ±10%, ±20%, or ±30% of the value).

Forming films—such as semiconductor films, insulation films, and metal films—can be used in the production of semiconductor devices. Processes for forming films include chemical vapor deposition (CVD) in which light energy or heat energy can be used. In accordance with this deposition process, a material for treatment is placed in an atmosphere of a CVD vapor, such as an organometallic compound. The CVD vapor adsorbed on the material is decomposed by exposure to light energy or heat energy. As a result, a film (e.g., a semiconductor film, dielectric film, or a metal film) can be formed on a surface of the material. One of the key components of the CVD process includes a liquid delivery and vaporization apparatus, which vaporizes liquid precursors into a CVD vapor form and delivers the CVD vapor to the CVD chamber. When the CVD vapor comes into contact with a heated substrate in the CVD chamber, the CVD vapor decomposes (reacts) and forms a film over the substrate. The quality of films formed by the CVD process can depend on the structure and performance of the liquid delivery and vaporization apparatus used in the deposition process. A steady and reliable flow of the supplied CVD vapor in the CVD process is desired so the concentration of the vapor can be accurately controlled.

The present disclosure relates to a liquid delivery and vaporization apparatus. Such apparatus can be integrated in, but not limited to, various CVD systems (e.g., atmospheric pressure CVD, low-pressure CVD, ultrahigh vacuum CVD, plasma-enhanced CVD, and atomic layer deposition (ALD), and metallo-organic CVD systems). In particular, the liquid delivery and vaporization apparatus includes a bellow structure as a buffer that can be integrated into a gas line of a CVD system to maintain the flow of material (e.g., CVD vapor) being delivered, according to some embodiments. A benefit, among others, of the bellow structure is improved film uniformity and quality.

The apparatus and method of the present disclosure can be employed for delivering CVD vapor for thin film deposition of materials for the manufacture of semiconductor devices. The liquid delivery and vaporization apparatus can assist with uniform etching and deposition, resulting in films with improved quality. Although the apparatus is described herein in the context of a CVD process, the apparatus can be applied to other deposition processes.

Figure 1:
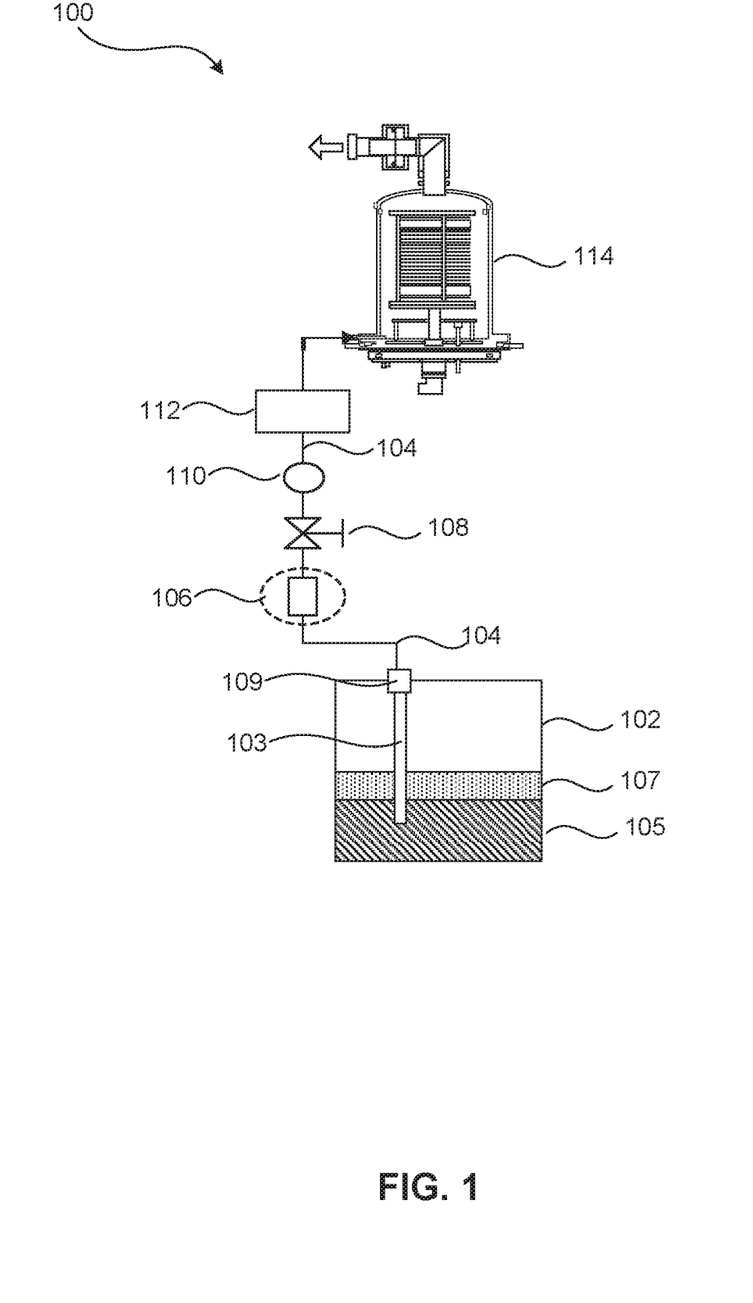
FIG. 1 is a schematic diagram of a liquid delivery and vaporization apparatus, in accordance with some embodiments.

FIG. 1 illustrates a schematic diagram of a liquid delivery and vaporization apparatus 100. Liquid delivery and vaporization apparatus 100 can include a vessel 102 for retaining the liquid to be delivered, a bellow 106 that receives the liquid from vessel 102 and is configured to cause a discharge of the liquid from the bellow in response to difference between internal pressure and the external pressure (e.g., atmospheric pressure bellow 106 is exposed to), a first valve 108, a second valve 110, a vaporizer 112 to produce a vapor based on the liquid received from bellow 106, and a CVD chamber 114, and one or more pipes 104 for connecting the aforementioned elements. In some embodiments, bellow 106 is in fluid communication with vessel 102 to receive the liquid from vessel 102 and in fluid communication with a downstream process to deliver the liquid. In some embodiments, bellow 106 is exposed to a constant external pressure and is configured to deliver the liquid under the constant external pressure when bellow 106 stops receiving the liquid from vessel 102. In some embodiments, the constant external pressure is atmospheric pressure.

In some embodiments, vessel 102 can include a chemical refill system. Vessel 102 can be constructed having a cylindrical, rectangular, or other suitable design. In some embodiments, a liquid 105 is placed in a lower portion of vessel 102 below a movable plunger 107. Pressure can be introduced into an upper chamber of vessel 102 to movable plunger 107 and therefore compressing liquid 105. Liquid 105 flows out of the vessel through a feeding tube 103 and a discharge outlet 109.

In some embodiments, bellow 106 receives liquid 105 from vessel 102. An internal volume of bellow 106 can be defined by the bellow's nominal diameter and length. In some embodiments, bellow 106 can include a deformable material. In some embodiments, bellow 106 can be configured to deform to discharge the liquid to vaporizer 112 under a constant external pressure (e.g., atmospheric pressure) when bellow 106 stops receiving the liquid from vessel 102. Bellow 106 can be subjected to corrosion by both the liquid flowing through it and the outside environment. The deformable materials for bellow 106 can be selected from a list of materials that is resistant to the liquid to be delivered, according to some embodiments. Bellow 106 can further include a material that is fluid-impermeable. Bellow 106 can include, but is not limited to, stainless steel, bronze, nickel-copper alloy, carbon steel, and a copper-based material. In some embodiments, bellow 106 can include a polymeric material including, but not limited to, polyisoprene, polybutadiene, chloroprene rubber, polychloroprene, neoprene, baypren, butyl rubber, halogenated butyl rubbers, styrene-butadiene rubber, nitrile rubber, ethylene propylene rubber, ethylene propylene diene rubber, epichlorohydrin rubber, polyacrylic rubber, silicone rubber, fluorosilicone rubber, fluoroelastomers, viton, tecnoflon, fluorel, perfluoroelastomers, polyether block amides, chlorosulfonated polyethylene, and ethylene-vinyl acetate.

Figure 2A:
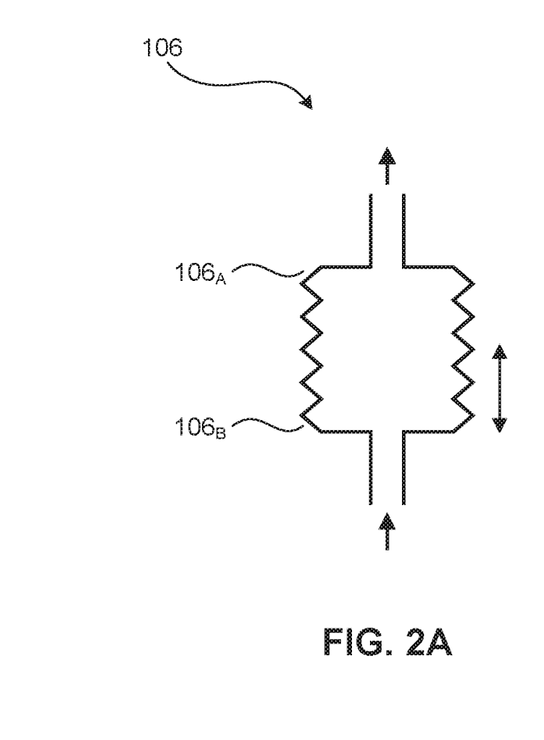
FIGS. 2A and 2B are schematic diagrams of a bellow in an expanded mode (FIG. 2A) and in a compressed mode (FIG. 2B), in accordance with some embodiments.
Figure 2B:
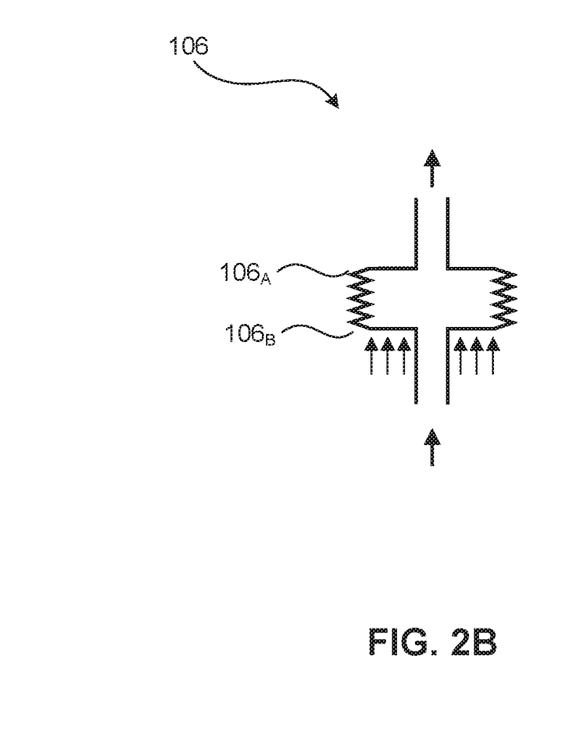

Referring to FIGS. 2A and 2B, schematics of bellow 106 in an expanded mode (FIG. 2A) and in a compressed mode (FIG. 2B) are illustrated. The atmospheric pressure is about 14.6 psi. FIG. 2A shows bellow 106 in the expanded mode when the liquid delivery and evaporation apparatus is under a normal working condition. For example, under the normal working condition, liquid 105 is pumped from vessel 102 to bellow 106, in which bellow 106 can have an internal pressure of about 14.6 psi, which is equal to the atmospheric pressure. FIG. 2B shows bellow 106 in the compressed mode when the liquid delivery and evaporation apparatus is under an abnormal working condition. For example, under the abnormal working condition, a malfunction event can occur, where vessel 102 stops supplying liquid 105 and causes an unfinished process run of CVD and etching. When vessel 102 stops supplying liquid 105, the internal pressure of bellow 106 decreases. In some embodiments, the internal pressure can decrease to less than 14.6 psi. In some embodiments, the internal pressure can decrease to around 0 psi. The constant external pressure (e.g., atmospheric pressure, which is about 14.6 psi) can compress the bellow and discharge the liquid in bellow 106. In some embodiments, the internal volume of bellow 106 decreases when an internal pressure of the bellow is less than the constant external pressure. In some embodiments, the constant external pressure is atmospheric pressure (e.g., about 14.6 psi).

Bellow 106 can be designed with an internal volume larger than the liquid needed for a single process run. In some embodiments, the internal volume of bellow 106 is between about 5 ml and about 900 ml or between about 10 ml and about 100 ml. In some embodiments, a diameter of bellow 106 is between about 0.5 cm and about 10 cm or between about 0.5 cm and about 1 cm. In some embodiments, the diameter of bellow 106 is about 0.6 cm. In some embodiments, a decrease of the internal volume is greater than a volume of the liquid for a single process run.

In some embodiments, the liquid discharged from bellow 106 is between about 1 ml and about 500 ml or between about 10 ml and about 20 ml. In some embodiments, the liquid discharged from bellow 106 can supply one complete process run for a downstream application (e.g., CVD process). In some embodiments, the liquid discharged from bellow 106 can supply more than one complete process run for the downstream application (e.g., CVD process).

In some embodiments, bellow 106 can include a fixed first end $106_A$ and a flexible second end $106_B$. Fixed first end $106_A$ can be mounted at tie-in point of pipes of the liquid delivery and vaporization apparatus, in which flexible second end $106_B$ can move freely in an axial direction towards fixed first end $106_A$ by a mechanical force. A tie-in point refers to a location on an existing pipe for a new pipe connection. In some embodiments, the mechanical force is created by a pressure difference between an internal pressure of bellow 106 and pressure outside of bellow 106 (e.g., atmospheric pressure).

In some embodiments, a liquid flow control device (not shown in the figures) for regulating flow rate of liquid discharged from the bellow can be included in the liquid delivery and vaporization apparatus to produce a controlled liquid flow stream. In some embodiments, the liquid flow control device can be a resilient connector, such as a compression spring integrated onto the bellow. When the internal pressure of the bellow decreases and the liquid in the bellow is discharged by compression of bellow 106 under atmospheric pressure, the resilient connector can provide linear control of the force (e.g., force caused by the pressure difference between internal pressure and constant external pressure) added towards the bellow and allows a constant pressure to be applied to the liquid inside bellow 106, thereby achieving a regulated liquid flow. By regulating the pressure to bellow 106, a regulated flow at a desired rate can be accurately and reliably obtained. The apparatus can also include an optional flow regulator to meter the liquid at a desired rate independent of the compression of the bellow, according to some embodiments.

The liquid delivery and vaporization apparatus can also include various control valves to control and regulate liquid flow in the apparatus. These valves can respond to signals generated by independent devices, such as flow meters or temperature gauges. In some embodiments and in referring to FIG. 1, the valves can include first valve 108 (e.g., handle valve) for engineer gas line maintenance and second valve 110 (e.g., auto valve or pneumatic valve) for process and control chemical supply. First valve 108 (e.g., handle valve) can be designed for engineer manual control in gas line isolation. First valve 108 (e.g., handle valve) can be open when the liquid delivery and vaporization apparatus is in liquid delivery and vaporization process and closed for gas line maintenance (e.g., pumping out chemical, checking leakage, or replacing gas line components). Second valve 110 (e.g., auto valve or pneumatic valve) can be set open or close based on a process recipe. Second valve 110 (e.g., auto valve or pneumatic valve) can be open when the liquid delivery and vaporization apparatus is in liquid delivery and vaporization process and also regulate liquid flow in the apparatus.

In some embodiments, the liquid delivery and vaporization apparatus can further include a dosing valve, a pressure reducing valve, a pressure relief valve, a diaphragm valve, a high vacuum auto valve, pneumatic valve, a variable leak valve, or a combination thereof. The control valves can be fitted with actuators and positioners. Pneumatically-actuated globe valves and diaphragm valves can be used for control purposes. Quarter-turn valves, such as modified ball and butterfly valves, can also be used to isolate or regulate the flow of a liquid. The control valves can include hydraulic actuators, which can respond to changes of pressure or flow and can open/close the valve without use of an external power source.

The liquid delivery and vaporization apparatus can include vaporizer 112 for receiving and vaporizing liquid 105. The vaporization can be carried out without a carrier gas or vaporizer 112 can include means for introducing a carrier gas to form a mixture with the vapor (e.g., CVD vapor) and the carrier gas (e.g., argon). The carrier gas can be introduced through an inert carrier gas inlet of vaporizer 112 (not shown in the figures).

Vaporizer 112 can be equipped with at least one inlet for liquid 105 and an outlet for a vaporized gas. In some embodiments, vaporizer 112 can have a shape of a sphere, an ellipsoid, a barrel, a cylinder, a cone, a truncated cone, a hemisphere, or combinations thereof. In some embodiments, vaporizer 112 can be heated to a desired temperature in accordance with the type and the supplied amount of liquid, the concentration of the vaporized gas, and other operating conditions. The heating can be conducted using a ribbon heater wound around vaporizer 112, a block heater having a shape covering vaporizer 112, or by circulation of hot air or a liquid heat medium. In some embodiments, the temperature of vaporizer 112 is different depending on the operating conditions of the downstream application (e.g., CVD process). In some embodiments, the temperature is between about 40° C. and about 250° C.

The liquid delivery and vaporization apparatus can further include various components to receive the vapor according to different downstream processes. For example, the liquid delivery and vaporization apparatus can further include CVD chamber 114 to receive vapor from vaporizer 112. CVD chamber 114 can be adapted to hold a substrate for a film deposition using the vapor. In some embodiments, CVD chamber 114 can be a cold-wall system. In cold-wall systems, the substrate can be heated by inductive coupling, radiant heating, or direct electrical resistance heating of internal support elements. In these systems, the substrate can be positioned inside a vacuum chamber, and induction coils can be arranged exterior to the vacuum chamber. The substrate can be mounted on a platform adapted for heating by radio frequency (RF) energy. By localizing heat to the substrate, the CVD process can be directed to the heated areas.

In some embodiments, CVD chamber 114 can be a hot-wall system. Hot-wall systems rely on radiant heating elements arranged to create a heated reaction and deposition zone. Conduction and convection heating approaches can also be used in the hot-wall system. In some embodiments, the liquid delivery and vaporization apparatus can include multiple CVD chambers (e.g., 4 CVD chambers).

In some embodiments, CVD chamber 114 is an ALD chamber that provides conformal thin film deposition. ALD processes feature sequential alternating exposure of chemical precursors that react with the substrate. In an ALD process, a first liquid (e.g., a first precursor) is pulsed into a reaction chamber by the liquid delivery and vaporization apparatus for a predetermined amount of time to allow the first precursor to react with the substrate surface. Subsequently, the reaction chamber is purged with an inert gas to remove any unreacted precursor and reaction by-products. A second liquid (e.g., a second precursor) is then pulsed into the reaction chamber by the liquid delivery and vaporization apparatus to react with the reacted first precursor and form one or more atomic layers of the desired material. This process is then cycled until a desired film thickness is achieved. During the ALD process, the bellow (e.g., bellow 106) can serve as a buffer system to ensure complete and reliable deposition of each precursor.

In some embodiments, the liquid delivery and vaporization apparatus can further include a buffer tank (not shown in the figures.). The buffer tank can have substantially the same size and shape as the vaporizer (e.g., vaporizer 112). The vaporizer and the buffer tank can be covered with a block heater to heat these components to a desired temperature. The vaporizer can supply vapor to the CVD chamber through the buffer tank.

In some embodiments, the liquid delivery and vaporization apparatus can further include a monitoring device for monitoring pressure of liquid 105 in vessel 102. In some embodiments, the monitoring device can include an alarm, which can send an audio or visual signal when the internal pressure of vessel 102 is in an abnormal working condition. In some embodiments, bellow 106 can continue to discharge liquid 105 (in bellow 106) using atmospheric pressure to finish the process run while the alarm sends signals.

Figure 3:
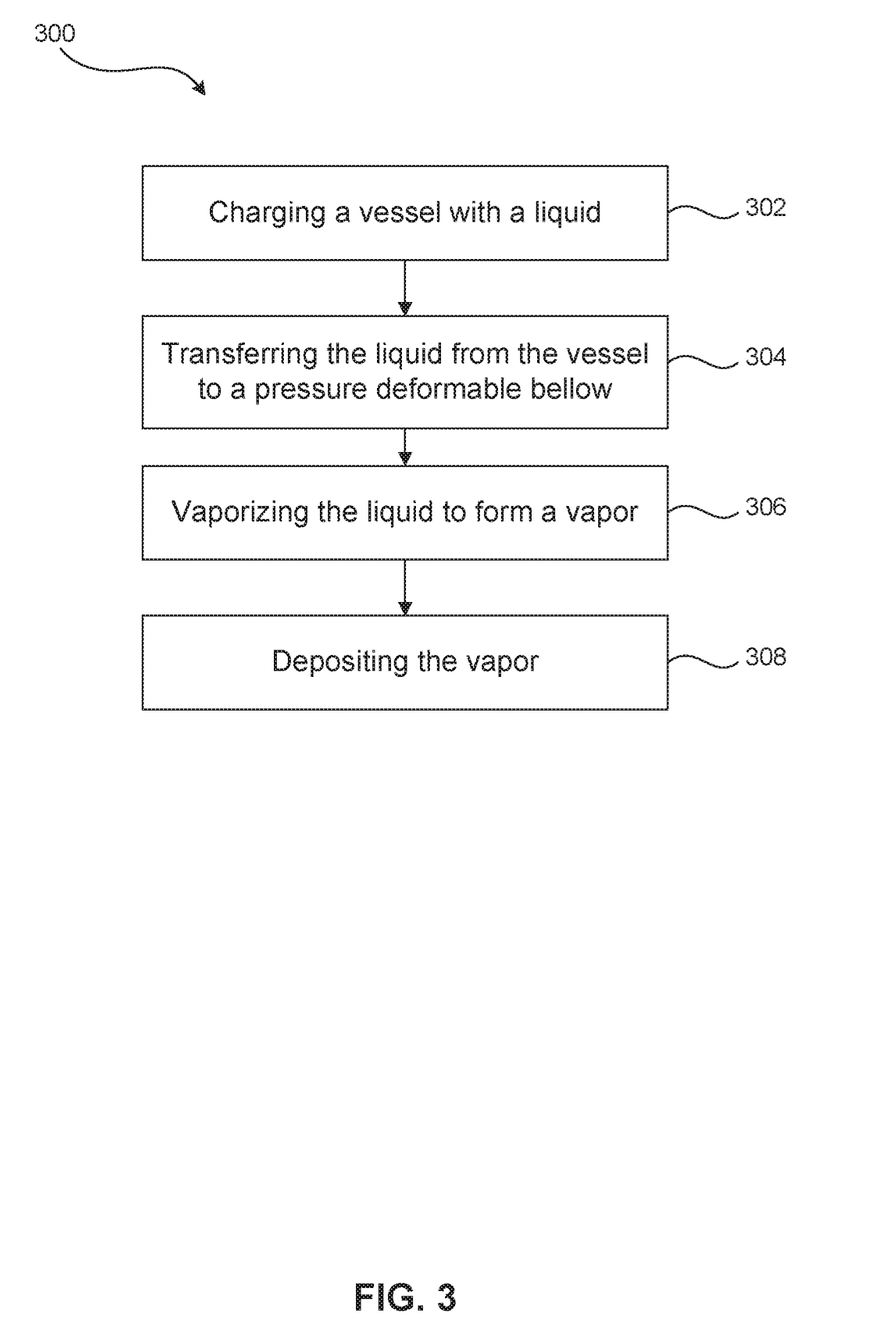
FIG. 3 is a flowchart of an method for delivering and vaporizing a liquid, in accordance with some embodiments.

FIG. 3 is a flowchart of an method 300 for delivering and vaporizing a liquid, in accordance with some embodiments. It should be understood that the steps shown in method 300 are not exhaustive and that other operations can be performed as well before, after, or between any of the illustrated operations. The operations of method 300 can be performed by liquid delivery and vaporization apparatus 100 of FIG. 1.

Referring to FIG. 3, method 300 starts at operation 302, in which a vessel (e.g., vessel 102) is charged with a liquid (e.g., liquid 105). Operation 302 can include charging the vessel with one or more liquids, such as CVD precursors. The charging can be accomplished manually or by an automatic chemical refill system.

The CVD precursors can include halides, carbonyls, hydrides, and metallo-organics. The halogens in the halides can include fluorine, chlorine, bromine and iodine. Metal carbonyls can also be used. The metal carbonyls can include transition metals including the first (3d), Sc, Ti, V, Cr, Mn, Fe, Co, and Ni; the second (4d), Y, Zr, Nb, Mo, Tc, Ru, Rh, Pd, and Ag; and the third (5d), Hf, Ta, W, Re, Os, Ir, Pt, and Au. In some embodiments, the metal carbonyls can include nickel carbonyl, $Ni(CO)_4$, and iron carbonyl, $Fe(CO)_5$. In some embodiments, metal carbonyls can include the carbonyl halides and the carbonyl-nitricoxide complexes. Hydrides can be used to deposit single elements, such as boron or silicon. They can also be used in conjunction with metallo-organics to form III-V and II-VI semiconductor compounds. In some embodiments, the hydrides can include elements of groups Mb, IVb, Vb, and VIb. In some embodiments, the hydrides can include arsine, diborane, germane, ammonia, phosphine, hydrogen sulfide, stibine, hydrogen selenide, silane $SiH_4$, and hydrogen telluride. The metallo-organics can include metals of groups IIa, IIb, IIIb, IVb, Vb, and VIb, which are non-transitional. The metallo-organics thus complement the halides and carbonyls, which are the precursors for the deposition of transition metals (groups IVa, Va, and VIa) and their compounds. The metallo-organics can include compounds of elements, such as silicon, phosphorus, arsenic, selenium, and tellurium. Metallo-organic can also include alkyl, alicyclic, and aryl compounds.

Method 300 proceeds to operation 304, in which the liquid is transferred from the vessel (e.g., vessel 102) to a pressure deformable bellow (e.g., bellow 106) and to a vaporizer (e.g., vaporizer 112). The pressure deformable bellow is configured to deform to discharge the liquid to a vaporizer under a constant external pressure when the bellow stops receiving the liquid from the vessel. In some embodiments, the constant external pressure is atmospheric pressure. In operation 304, a pressure means is introduced into the vessel and the liquid is forced to flow through a pressure deformable bellow. The pressure deformable bellow can include a pressure deformable material, such as stainless steel. During a normal working condition, the vessel can provide a continuous liquid feed through the bellow, in which the bellow is in an expanded mode. During an abnormal working condition, a malfunction event of deficient or no liquid feed occurs. For example, vessel (e.g., liquid chemical refill system) stops supplying the liquid during an unfinished cycle of CVD and etching. The internal pressure of the bellow decreases due to the discontinued liquid supply. In some embodiments, the internal pressure is less than 14.6 psi (e.g., atmospheric pressure). In some embodiments, the internal pressure is around 0 psi. The constant external pressure (e.g., atmospheric pressure) can compress the bellow and cause the liquid to discharge from the bellow. The discharged liquid from the bellow can supply the liquid needed to complete the unfinished process run.

Method 300 proceeds to operation 306, in which the liquid is vaporized to form a vapor. Operation 306 can include producing a vapor using a vaporizer (e.g., vaporizer 112). In some embodiments, the vaporization process can include injecting the liquid in a vaporizer (vaporization chamber) towards injectors (e.g., car injectors). In some embodiments, the vaporization can be carried out "neat" or can include means for introducing a carrier gas to the vaporizer to form a mixture of the vapor (e.g., CVD vapor) and the carrier gas (e.g., argon). The carrier gas can be introduced through an inert carrier gas inlet of the vaporizer. The carrier gas can include hydrogen gas and inert gases, such as argon. The carrier gases act as a carrier, enhancing surface reaction and improving reaction rate, thereby increasing deposition.

Method 300 proceeds to operation 308, in which the vapor is deposited on a substrate by a deposition process, such as CVD. During operation 308, the vapor which contains the CVD precursor is introduced into a CVD chamber (e.g., CVD chamber 114). A wafer (substrate) is exposed to the vapor (volatile precursors), which react and/or decompose on the substrate surface to produce a desired film. In some embodiments, volatile by-products are also produced, which can be removed by gas flow through the CVD chamber. In some embodiments, a carrier gas can be mixed with the vapor prior to depositing the vapor on the substrate.

Figure 4:
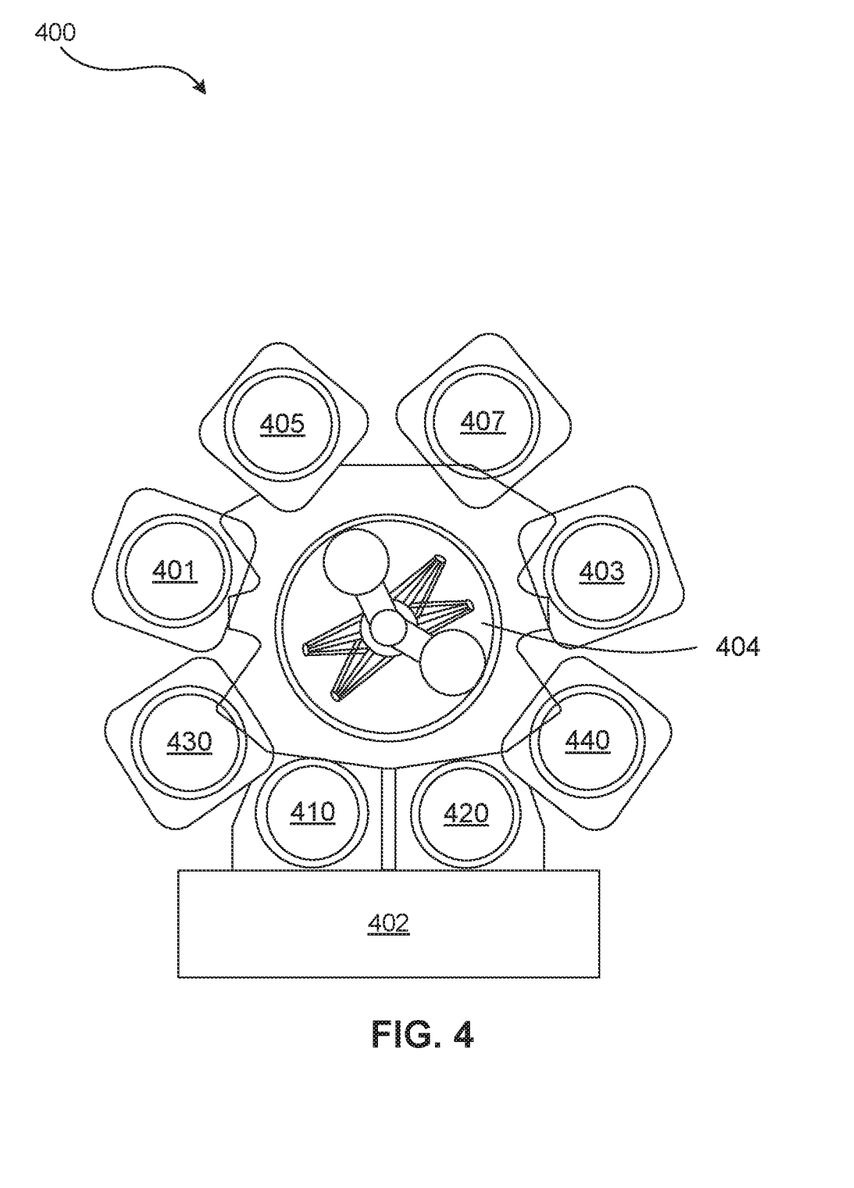
FIG. 4 is a schematic diagram of a semiconductor manufacturing system, in accordance with some embodiments.

It should be understood that the liquid delivery apparatus can be used with or without the vaporizer. And the embodiments described herein can be incorporated into other fabrication systems, such as a semiconductor manufacturing system using multiple chambers. Referring to FIG. 4, a semiconductor manufacturing system 400 is illustrated, according to some embodiments. Semiconductor manufacturing system 400 has several reaction chambers in a cluster configuration. The multiple reaction chambers can be used to deposit various layers, such as dielectric layers, barrier layers, semiconductor layers, adhesion layers, anti-reflecting layers, and any other suitable layers. Each reaction chamber can be connected to a corresponding liquid delivery and vaporization apparatus as described in the present disclosure. Or multiple reaction chambers can connect to a single liquid delivery and vaporization apparatus, if the same vapor is used in the different chambers. The liquid delivery and vaporization apparatus with a bellow structure and clustered reaction chambers can sequentially deposit thin films without exposing the substrate to ambient conditions between deposition processes. For example, under normal working conditions, the liquid precursor is pumped from the vessel (e.g., vessel 102 in FIG. 1) to the bellow (e.g., bellow 106 in FIG. 1) and flows through the bellow and pipes (e.g., pipe 104 in FIG. 1) into the vaporizer (vaporizer 112 in FIG. 1). The liquid precursor can be vaporized in the vaporizer to form a CVD vapor, which can be subsequently delivered into CVD deposition chambers (e.g., a barrier layer deposition chamber 403, an n-type work function layer deposition chamber 405, and a p-type work function layer deposition chamber 407). The bellow can have an internal pressure of about 14.6 psi, which is equal to atmospheric pressure. Under an abnormal working condition, a malfunction event can occur, where the vessel stops supplying the liquid precursor causing internal pressure of the bellow to decrease. In some embodiments, the internal pressure can decrease to less than 14.6 psi. In some embodiments, the internal pressure can decrease to around 0 psi. The constant external pressure (e.g., atmospheric pressure, which is about 14.6 psi) can compress the bellow and discharge the liquid precursor in the bellow and deliver the liquid precursor into the vaporizer for vaporization. In some embodiments, the CVD deposition chambers can be maintained at a chamber pressure between about 1 Torr and about 20 Torr during an etching/deposition process.

As shown in FIG. 4, semiconductor manufacturing system 400 can include two load lock chambers 410 and 420, two degassing chambers 430 and 440, a dielectric deposition chamber 401, barrier layer deposition chamber 403, n-type work function layer deposition chamber 405, and p-type work function layer deposition chamber 407. It should be understood that the chamber configuration shown in FIG. 4 is not limiting and that more or less chambers can be integrated in the illustrated semiconductor manufacturing system.

Load lock chambers 410 and 420 are configured to receive a wafer transferred from a load port 402. Load lock chambers 410 and 420 are vented to a pressure equivalent to the load port 402 while the wafer is transferred between load port 402 and load lock chamber 410 or 420. When transferring the wafer from load lock chamber 410 or 420 to one of the chambers in semiconductor manufacturing system 400, load lock chambers 410 and 420 are pumped down to a pressure at or substantially near vacuum. In some embodiments, semiconductor manufacturing system 400 can include at least one mechanical means such as a robot arm 404 to transfer the wafer from the pumped-down load lock chamber 410 or 420 to one of the reaction chambers. Semiconductor manufacturing system 400 can also include degassing chambers 430 and 440 that are used to activate and remove gaseous and/or liquid substances, such as moisture and oxygen from substrates to prevent change in thin film characteristics that may cause deposition failure.

In some embodiments, dielectric deposition chamber 401 is connected to the liquid delivery and vaporization apparatus loaded with precursors for high-k dielectric growth. For example, precursors such as hafnium tetrachloride (HfCl$_4$), water (H$_2$O), and any other suitable precursors are provided through the liquid delivery and vaporization apparatus to dielectric deposition chamber 401.

In some embodiments, barrier layer deposition chamber 403 is connected to the liquid delivery and vaporization apparatus loaded with precursors for barrier layer growth. For example, barrier layer deposition chamber 403 can be loaded with precursors for multi-cycle deposition and metallic halide etching processes, through the liquid delivery and vaporization apparatus, to form conformal barrier layers with improved step coverage. Barrier layer deposition chamber 403 can be operated with or without activated plasma during the metallic halide etching process. In some embodiments, barrier layer deposition chamber 403 can be an ALD chamber that can also perform in-situ metallic halide etching processes. In some embodiments, barrier layer deposition chamber 403 can be maintained at a temperature between room temperature (between about 20° C. and about 25° C.) and about 200° C. or between about 200° C. and about 1000° C. In some embodiments, barrier layer deposition chamber 403 can be maintained at a chamber pressure between about 1 Torr and about 20 Torr during a metallic halide etching process. In some embodiments, barrier layer deposition chamber 403 can be connected to the liquid delivery and vaporization apparatus for precursors, such as WCl$_x$, WF$_x$, TaCl$_x$, TiCl$_x$, NH$_3$, PDMAT, and/or any other suitable precursors, where 'x' can be between about 1 and about 6.

In some embodiments, an n-type work function layer deposition chamber 405 is connected to the liquid delivery and vaporization apparatus loaded with precursors for n-type work function layer deposition. For example, deposition chamber 405 can be loaded with precursors for multi-cycle deposition and metallic halide etching processes, through the liquid delivery and vaporization apparatus, to form n-type work function layers. In some embodiments, deposition chamber 405 can be an ALD chamber that can also perform in-situ metallic halide etching processes. In some embodiments, deposition chamber 405 can be maintained at a temperature between room temperature (between about 20° C. and about 25° C.) and about 200° C. or between about 200° C. and about 1000° C. In some embodiments, deposition chamber 405 can be maintained at a chamber pressure between about 1 Torr and about 20 Torr during a metallic halide etching process. In some embodiments, n-type work function layer deposition chamber 405 can be connected to the liquid delivery and vaporization apparatus for precursors, such as WCl$_x$, SnCl$_x$, NbCl$_x$, MoCl$_x$, TEA, and/or any other suitable precursors, where 'x' can be between about 1 and about 6.

In some embodiments, a p-type work function layer deposition chamber 407 is connected to the liquid delivery and vaporization apparatus loaded with precursor for p-type work function layer deposition. For example, deposition chamber 407 can be loaded with precursors for multi-cycle deposition and metallic halide etching processes, through the liquid delivery and vaporization apparatus, to form p-type work function layers. In some embodiments, deposition chamber 407 can be an ALD chamber that can also perform in-situ metallic halide etching processes. In some embodiments, deposition chamber 407 can be maintained at a temperature between room temperature (between about 20° C. and about 25° C.) and about 200° C. or between about 200° C. and about 1000° C. In some embodiments, deposition chamber 407 can be maintained at a chamber pressure between about 1 Torr and about 20 Torr during a metallic halide etching process. In some embodiments, p-type work function layer deposition chamber 407 can be connected to the liquid delivery and vaporization apparatus for precursors, such as WCl$_x$, SnCl$_x$, NbCl$_x$, MoCl$_x$, TEA, and/or any other suitable precursors, where 'x' can be between about 1 and about 6.

In some embodiments, cooling chambers can be included to allow a wafer to cool down to a desired temperature at an appropriate cooling rate in between various thin film growth processes without exposure to ambient conditions. In some embodiments, additional chambers (e.g., metal layer deposition chambers) can be included in semiconductor manufacturing system 400 for depositing any suitable material used to form semiconductor structures.

A CVD process using semiconductor manufacturing system 400 is described in the present disclosure. In some embodiments, a substrate can be first transferred from load lock chamber 410 and/or 420 to degassing chamber 430 or 440 using robot arm 404. Then, the wafer can be sent into high-k dielectric layer deposition chamber 401 for dielectric layer deposition. In some embodiments, after a high-k dielectric layer is formed, the wafer can be then transferred from chamber 401 to deposition chamber 403 for the growth of a barrier layer. In some embodiments, a barrier layer is optional and the wafer can be transferred from deposition chamber 401 to n-type work function layer deposition chamber 405 to deposit an n-type work function layer. After the deposition of an n-type work function layer, the wafer can be transferred to p-type work function layer deposition chamber 407 to deposit a p-type work function layer. Alternatively, the wafer can be transferred from deposition chamber 401 to p-type work function layer deposition chamber 407 to deposit a p-type work function layer. In some embodiments, the wafer can then be parked at load lock chambers 410 and 420 using robot arm 404 to raise the vacuum level to a level comparable to load port 402, and then transferred to load port 402 and taken out for further semiconductor processing.

In accordance with various embodiments of this disclosure, the apparatus with the pressure deformable bellow for liquid delivery and vaporization in semiconductor manufacturing provides, among other things, benefits of (i) using atmospheric pressure as an external force to compress the bellow to offer continuous chemical supply without use of an external power source to reduce cost; (ii) providing a complete chemical run during a malfunction event when a liquid chemical supply stops; and (iii) a higher reliability of chemical deposition process due to a buffer structure (bellow).

Various embodiments in accordance with this disclosure provide an apparatus for delivering a liquid to a downstream process. In some embodiments, the apparatus can include a vessel configured to retain the liquid; a bellow in fluid communication with the vessel to receive the liquid from the vessel and in fluid communication with the downstream process to deliver the liquid. In some embodiments, the bellow is exposed to a constant external pressure and is configured to deliver the liquid under the constant external pressure when the bellow stops receiving the liquid from the vessel. In some embodiments, the constant external pressure is atmospheric pressure. In some embodiments, the bellow can include a pressure deformable material. In some embodiments, an internal volume of the bellow decreases when an internal pressure of the bellow is less than the constant external pressure.

Various embodiments in accordance with this disclosure also provides a method for delivering and vaporizing a liquid. The method can include charging a vessel with a liquid; transferring the liquid from the vessel to a bellow, where the bellow is configured to deform to discharge the liquid to a vaporizer under a constant external pressure when the bellow stops receiving the liquid from the vessel; and vaporizing, in the vaporizer, the liquid to form a vapor.

Various embodiments in accordance with this disclosure also provides a semiconductor manufacturing system. The semiconductor manufacturing system can include a vessel configured to retain the liquid; a bellow in fluid communication with the vessel to receive the liquid from the vessel and in fluid communication with a downstream process to deliver the liquid; a vaporizer configured to receive the liquid and to produce a vapor; one or one or more chemical vapor deposition (CVD) chambers configured to receive the vapor and to hold a substrate for deposition of a component of the vapor on the substrate, and one or more pipes configured to connect the vessel, the bellow, the vaporizer, and the one or more CVD chambers. In some embodiments, the bellow is exposed to a constant external pressure and is configured to deliver the liquid under the constant external pressure when the bellow stops receiving the liquid from the vessel.

It is to be appreciated that the Detailed Description section, and not the Abstract of the Disclosure, is intended to be used to interpret the claims. The Abstract of the Disclosure section can set forth one or more but not all exemplary embodiments contemplated and thus, are not intended to be limiting to the subjoined claims.

The foregoing disclosure outlines features of several embodiments so that those skilled in the art can better understand the aspects of the present disclosure. Those skilled in the art will appreciate that they can readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they can make various changes, substitutions, and alterations herein without departing from the spirit and scope of the subjoined claims.

What is claimed is:

1. A semiconductor manufacturing system, comprising:
   a vessel configured to retain a liquid;
   a bellow in fluid communication with the vessel to receive the liquid from the vessel and in fluid communication with a downstream process to deliver the liquid, wherein the liquid flows in and through the bellow and wherein the bellow is exposed to a constant external pressure and is configured to deliver the liquid in the bellow under the constant external pressure when the bellow stops receiving the liquid from the vessel;
   a vaporizer configured to receive the liquid and to produce a vapor;
   one or more chemical vapor deposition (CVD) chambers configured to receive the vapor and to hold a substrate for deposition of a component of the vapor on the substrate, and
   one or more pipes configured to connect the vessel, the bellow, the vaporizer, and the one or more CVD chambers.

2. The semiconductor manufacturing system of claim 1, wherein an internal volume of the bellow decreases when an internal pressure of the bellow is less than the constant external pressure.

3. The semiconductor manufacturing system of claim 1, wherein the constant external pressure is atmospheric pressure.

4. The semiconductor manufacturing system of claim 1, wherein the one or more CVD chambers comprise a dielectric deposition chamber, an n-type work function layer deposition chamber, a p-type work function layer deposition chamber, or a combination thereof.

5. The semiconductor manufacturing system of claim 1, wherein the one or more CVD chambers comprise at least one ALD chamber.

6. The semiconductor manufacturing system of claim 1, further comprising one or more load lock chambers and one or more degassing chambers.

7. A system for delivering a liquid to a deposition chamber, comprising:
   a vessel configured to retain the liquid; and
   a bellow fluidly coupled to the vessel to receive the liquid from the vessel and fluidly coupled to the deposition chamber to deliver the liquid to the deposition chamber, wherein the liquid flows in and through the bellow and wherein the bellow is exposed to an external pressure and is configured to deliver the liquid in the bellow under the external pressure in response to the bellow ceasing to receive the liquid from the vessel.

8. The system of claim 7, wherein the external pressure is atmospheric pressure.

9. The system of claim 7, wherein the bellow comprises a pressure deformable material.

10. The system of claim 9, wherein the pressure deformable material comprises stainless steel.

11. The system of claim 9, wherein the pressure deformable material is fluid-impermeable.

12. The system of claim 7, wherein an internal volume of the bellow decreases in response to an internal pressure of the bellow being less than the external pressure.

13. The system of claim 12, wherein a decrease of the internal volume is greater than a volume of the liquid for a single process run of the deposition chamber.

14. The system of claim 7, wherein the bellow comprises a fixed first end and a flexible second end.

15. The system of claim 14, wherein the flexible second end moves towards the fixed first end in response to the internal pressure being less than constant external pressure.

16. The system of claim 7, further comprising a liquid flow control device configured to regulate a flow rate of the liquid discharged from the bellow.

17. The system of claim 7, further comprising a vaporizer configured to receive and vaporize the liquid to produce a vapor for the deposition chamber.

18. A system for delivering and vaporizing a liquid, comprising:
   a vessel configured to retain the liquid;

a bellow fluidly coupled to the vessel to receive the liquid from the vessel and fluidly coupled to a downstream process chamber to deliver the liquid, wherein the liquid flows in and through the bellow and wherein the bellow is exposed to a constant external pressure and is configured to deliver the liquid in the bellow under the constant external pressure in response to the bellow ceasing to receive the liquid from the vessel; and a vaporizer configured to receive the liquid from the bellow and to produce a vapor.

19. The system of claim 18, further comprising a chemical vapor deposition (CND) chamber fluidly coupled to the vaporizer and configured to receive the vapor from the vaporizer.

20. The system of claim 18, further comprising at least one valve, between the bellow and the vaporizer, configured to control the fluid transfer from the bellow and the vaporizer.

\* \* \* \* \*